United States Patent
Tangudu et al.

(10) Patent No.: US 9,531,343 B2
(45) Date of Patent: Dec. 27, 2016

(54) SYSTEMS AND METHODS OF VARIABLE FRACTIONAL RATE DIGITAL RESAMPLING

(71) Applicant: Texas Instruments Incorporated, Dallas, TX (US)

(72) Inventors: Jawaharlal Tangudu, Karnataka (IN); Sachin Bharadwaj, Karnataka (IN); Sundarrajan Rangachari, Tamil Nadu (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/664,078

(22) Filed: Mar. 20, 2015

(65) Prior Publication Data

US 2016/0277007 A1    Sep. 22, 2016

(51) Int. Cl.
*H03K 5/00* (2006.01)
*G06F 17/10* (2006.01)
*H03H 11/04* (2006.01)

(52) U.S. Cl.
CPC .................... *H03H 11/04* (2013.01)

(58) Field of Classification Search
CPC .................................. H04B 10/616
USPC ............. 327/551–559; 341/61; 708/300, 313
See application file for complete search history.

(56) References Cited

U.S. PATENT DOCUMENTS

| | | | | |
|---|---|---|---|---|
| 5,907,295 A * | 5/1999 | Lin | ..................... | H03H 17/0685 341/50 |
| 6,714,144 B1 * | 3/2004 | Reed | ................ | G11B 20/10009 341/50 |
| 6,757,117 B1 * | 6/2004 | Livingston | ....... | G11B 20/10009 360/25 |
| 8,619,840 B2 * | 12/2013 | Ji | ....................... | H03H 17/0294 341/118 |
| 2007/0041438 A1 * | 2/2007 | Mogi | ..................... | G10L 19/02 375/232 |

OTHER PUBLICATIONS

Lars Erup, "Interpolation in Digital Modems—Part II: Implementation and Performance", IEEE Transactions on Communications, vol. 41, No. 6, Jun. 1993,,pp. 998-1008.
Michael Unser, "Splines: A Perfect Fit for Signal and Image Processing", IEEE Signal Processing Magazine, vol. 16, No. 6, Nov. 1999, pp. 22-38.
Fredric J. Harris, "Multirate Signal Processing for Communication Systems", Pearson Education, Inc., and Dorling Indersley Publishing, Inc., 2004, ISBN: 81-317-1597-3.

* cited by examiner

*Primary Examiner* — Dinh T Le
(74) *Attorney, Agent, or Firm* — Ronald O. Neerings; Frank D. Cimino (57) ABSTRACT

Example embodiments of the systems and methods of variable fractional rate digital resampling as disclosed herein achieve variable rate conversion. In the example embodiments, the input samples are upsampled by a factor N in an upsampler followed by a filter which then goes through a linear interpolator. The filter cleans the spectral images of the signal created due to the upsampling operation.

14 Claims, 9 Drawing Sheets

SYSTEMS AND METHODS OF VARIABLE FRACTIONAL RATE DIGITAL RESAMPLING

TECHNICAL FIELD

The present disclosure is generally related to telecommunications and, more particularly, is related to digital signal processing in telecommunications systems.

BACKGROUND

Sample rate conversion is essential in most signal processing applications. The need for sample rate conversion may arise due to various reasons, including, as examples: (a) designs with an Analog to Digital converter (ADC) rate different from a receive base-band symbol rate in digital communication systems; (b) variable bandwidth receive systems with a fixed analog-to-digital convertor (ADC) rate; and (c) designs with a digital-to-analog convertor (DAC) rate different from a transmit baseband sampling rate. Typical resampling approaches include Lagrange and B-Spline resampling to match the sampling rates.

Figure 1:
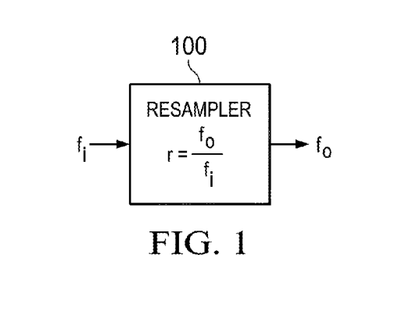
FIG. 1 is a block diagram of an example embodiment of a resampler circuit.

Many signal processing applications specify an estimate of the value of the sampled signal at particular time instants other than during the sampling instances. This is accomplished using digital sample rate convertors often referred to as resamplers. Resamplers may be broadly classified into fixed rate resamplers and variable rate resamplers. As shown in FIG. 1, fixed rate resamplers such as resampler 100 convert the input signal from a fixed input rate to a fixed output rate. With variable rate resamplers, either the input rate or the output rate or both are variable. The input and output rates of resampler 100 are related by a resampling ratio which may be defined as the ratio of output rate to input rate, $r=f_o/f_i$. Fixed rate conversion by simple integer ratios are well understood and may be implemented using polyphase structure and fixed coefficients. The need for resamplers may arise in both transmitter and receiver signal processing chains. There are heretofore unaddressed needs with previous variable rate resampling solutions.

SUMMARY

Example embodiments of the present disclosure provide systems of variable fractional rate digital resampling. Briefly described, in architecture, one example embodiment of the system, among others, can be implemented as follows: an upsampler configured to receive an input sequence at a first frequency and output a sequence at a second higher frequency; a filter configured to filter the sequence at the second higher frequency; and a linear interpolator configured to interpolate to an output rate.

Embodiments of the present disclosure can also be viewed as providing methods for variable fractional rate digital resampling. In this regard, one embodiment of such a method, among others, can be broadly summarized by the following steps: receiving an input sequence at a fixed rate; upsampling the input sequence at a second variable rate; filtering the upsampled sequence; and applying linear interpolation to the filtered sequence.

DETAILED DESCRIPTION

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

RF digital communication receivers generate a carrier frequency for the signal down conversion and a sampling clock for sampling the received continuous time signal. Typically, the carrier frequency and the desired sampling rate may not have a simple relationship. Two separate phase locked loops (PLL) may be used to generate the carrier and sampling clocks.

This analog approach demands significant area and power consumption. Example embodiments of the systems and methods of variable fractional rate digital resampling disclosed herein operate the receiver with a single PLL in conjunction with a variable rate resampler in the digital baseband. The choice of ADC rate may be governed by factors such as co-existence issues, analog filtering specifications, and ADC performance specifications. The variable rate resampler may convert the sample rate of the ADC output by interpolating the samples at the desired time instances based on the resampling ratio. Similarly, variable bandwidth systems with a fixed ADC rate necessitate the use of a variable rate resampler in the digital baseband.

The digital baseband sampling in the transmitter may not have a simple relationship with the DAC sampling rate due to similar reasons as in the receiver. In such cases, resamplers may be used to convert the baseband sampling rate to the desired rate based on the resampling ratio. Apart from the aforementioned uses, digital resamplers may also be used for correcting sampling time errors in a single carrier system which is caused due to drift in the reference crystal. The above mentioned reasons demonstrate the need for coming up with low complexity resampler architectures.

Figure 2A:
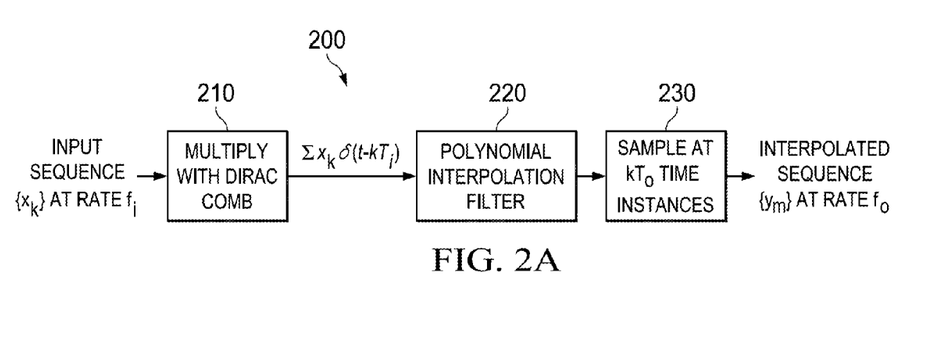
FIG. 2A is a block diagram of an example embodiment of a generic resampler.

A block diagram of generic resampler 200 is provided in FIG. 2A. Generic resampler 200 includes multiply with dirac comb block 210, polynomial interpolation filter 220 and, output sampler 230. Multiply and dirac comb block 210 converts an input sequence at sampling rate $f_i$ to a continuous time signal by multiplication of dirac comb deltas. Polynomial interpolation filter 220 attenuates the input images that repeat at multiples of the input frequency. Output sampler 230 samples the filter output at the desired frequency. The resampling process may be visualized as converting from discrete time to continuous time and then filtering and converting back to discrete time at the desired output rate.

Figure 2B:
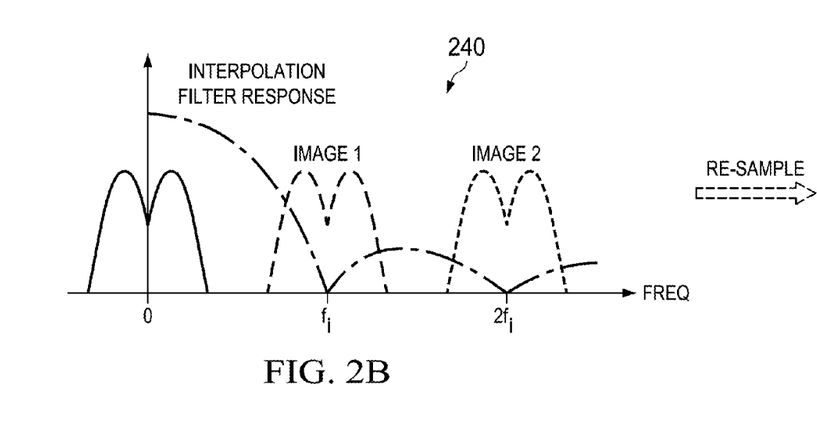
FIG. 2B is a signal diagram of an example embodiment of an interpolation filter response.
Figure 2C:
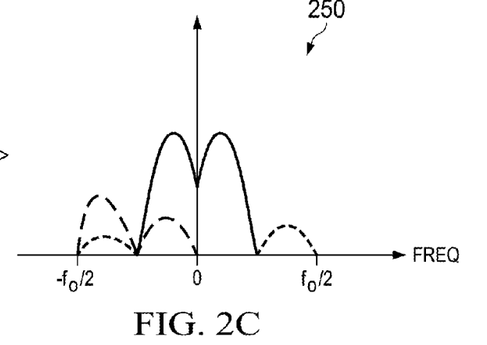
FIG. 2C is a signal diagram of an example embodiment of the response of FIG. 2B after sampling at the output rate.

FIG. 2B provides signal diagram 240 which demonstrates images of the signal at multiples of the input frequency. The interpolation filter attenuates those input images which repeat at the input frequency. A higher order polynomial interpolation filter (time-span) offers better image rejection. The resampled output of the interpolation filter and output sampler produces signal diagram 250 of FIG. 2C.

In many applications, the resampling ratio may be close to 1 (for example, in the range 0.5-2). A ratio that is far away from 1 can be brought closer to 1 by inserting a bank of decimation or interpolation-by-2 filters. Due to the varied nature of the sampling rates specified for different applications, there is a need for a variable rate resampler to support an arbitrary output sampling rate from a fixed sampling rate sigma-delta ADC. Previously, polynomial resamplers such as Lagrange and B-Spline resamplers have been used.

A resampling operation using Lagrange interpolation may be mathematically represented as:

$$y[(m_k + \mu_k)T_s] = \sum_{n=0}^{P} \left[ \sum_{i=ceil(\frac{-P}{2})}^{ceil(\frac{P}{2})} x[(m_k - i)T_s] b_n(i) \right] \mu_k^n$$

where $T_s$ is the input sampling period, P is the order of the polynomial, $\mu_k$ is the fractional delay from the nearest input sample on the left ($m_k$) and $b_n(i)$ is the nth sub-filter. The sub-filter taps can be easily determined by fitting a Pth order polynomial over the input samples. For Pth Order interpolation, the impulse response spans P+1 input sample periods.

B-Spline resamplers are based on B-Spline polynomials. B-Spline polynomials are symmetrical bell shaped functions constructed from (p+1) fold convolution of rectangular pulse $\beta^0$ represented as:

$$\beta^0 = \begin{cases} 1, & -\frac{1}{2} < x < \frac{1}{2} \\ \frac{1}{2}, & |x| = \frac{1}{2} \\ 0, & \text{otherwise} \end{cases}$$

These polynomials have a remarkable property that the derivatives up to p−1 order are continuous for a pth order B-Spline polynomial. In comparison, even the first derivative of the impulse response is not continuous for any order in case of Lagrange resampler. Further, this property implies that the B-Spline resamplers provide far better attenuation when compared to a Lagrange resampler for the same order. It is important to note that the fourier transform of $\beta^p(x)$ is $\text{sinc}^{(p+1)}(f)$. Therefore, a higher order B-Spline will have better side-lobe attenuation at the expense of larger in-band droop.

The time domain response of a 3rd order Lagrange resampler has its derivative discontinuous unlike B-Spline. B-Spline has far better side-lobe attenuation but a poorer in-band droop when compared to a Lagrange resampler. The attenuation provided by first side lobe is at least 52 dB for 3rd order B-Spline as compared to 29 dB for the same order Lagrange resampler. The in-band droop may be corrected by a droop correction filter. The droop correction filter may be placed either before or after the resampler. If it is placed before the resampler, it can be made a fixed coefficient filter since the droop is a function of normalized input frequency. If it is placed at the resampler output with variable resampling ratio, a programmable droop correction filter may be implemented.

Figure 3:
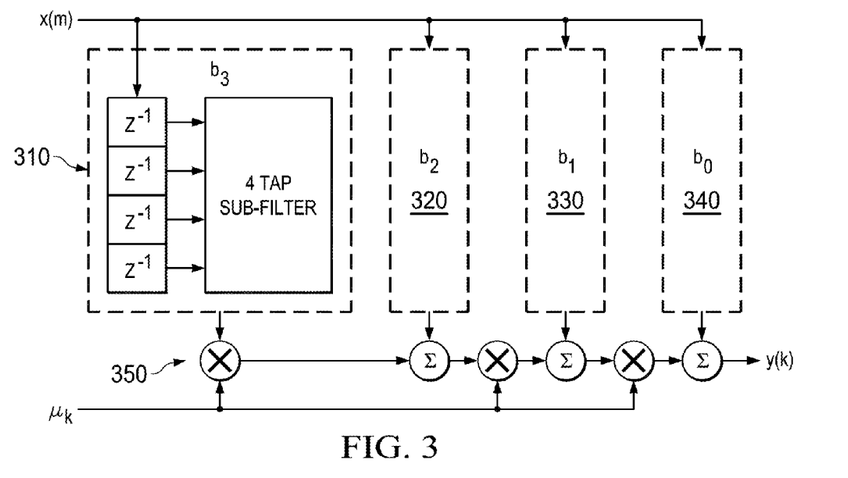
FIG. 3 is a block diagram of an example embodiment of a farrow structure polynomial resampler.

As provided in FIG. 3, a polynomial resampler may be efficiently implemented using a Farrow architecture that consists of P+1 sub-filters 310, 320, 330, 340 with fixed coefficients. The output of the sub-filters is fed to multiply-and-add circuit 350 which implements the polynomial evaluation at the fractional sampling time instant given by $\mu_k$. Farrow architecture for a generic Pth order polynomial resampler will consist of P+1 sub-filters and a similar multiply-and-add circuit as shown in FIG. 3.

Example embodiments of the systems and methods of variable fractional rate digital resampling as disclosed herein achieve variable rate conversion. In the example embodiments, as provided in FIG. 4, the input samples are upsampled by a factor N in upsampler 410 followed by filter 420 which then goes through linear interpolator 430 to the desired output rate.

Figure 4:
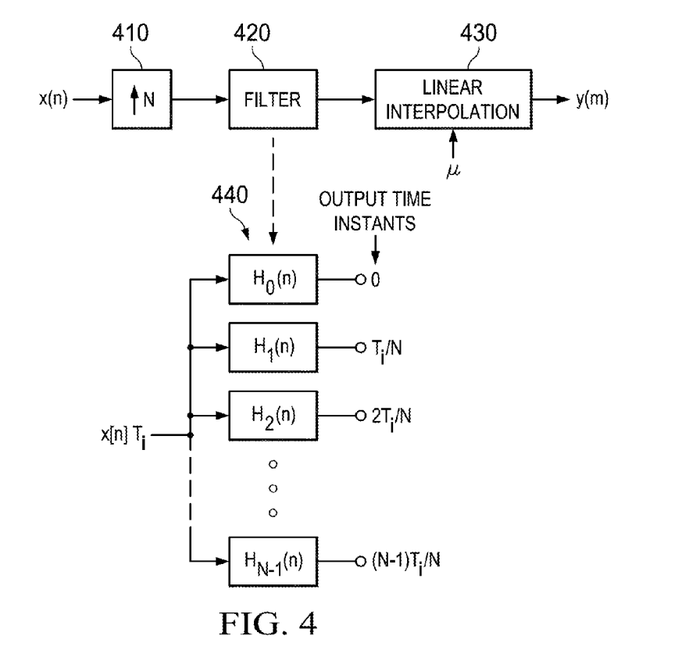
FIG. 4 is a block diagram of an example embodiment of a system of variable fractional rate digital resampling.

Filter 420 cleans the spectral images of the signal created due to the upsampling operation in upsampler 410. In a receive application, the portion of spectral images which alias back into in-band after resampling are cleaned. The spectrum of the signal after filtering has substantially identical copies at $k*N*F_i$ where k is an integer and $F_i$ is the input sampling rate. The Fourier transform of linear interpolator 430 has nulls at $k*N*F_i$ for all integer values of k other than zero. Therefore, spectral nulls due to linear interpolation provide suppression to the signal images which may be aliased in-band depending on the output sampling rate. The upsampling factor N may be a function of target attenuation A and input oversampling ratio, $OSR^i$, and is given by $$A(dB) \leq 40\log10(2N*OSR^i),$$

$$OSR^i = \frac{F_i}{B}$$

where B is the two-sided bandwidth of the desired signal and A is defined as the ratio of the aliased in-band image power to the signal power. The above formula is based on attenuation provided by $\text{sinc}^2$ spectral response of linear interpolator of the first image at $N*F_i$.

In an example embodiment, filter 420, following upsampler 410, runs at N times the input rate $F_i$. Therefore, filter 420 may be visualized as a classical polyphase filter where each polyphase can be realized as a phase of sub-filter 440, the output of which corresponds to different time instants $pT_i/N, T_i=1/F_i, 0 \leq p \leq N-1$. The process of combining the upsampling filter function with the linear interpolation function may be implemented to achieve any generic output rate. It does not use the computations of all the polyphase outputs of sub-filter 440. Instead, for every output sample, two adjacent polyphase outputs of sub-filter 440 may be used. This observation leads to two approaches, among others, for the macro-architecture.

In example embodiments in which the upsampling filter has L taps (fixed coefficients) per polyphase, possible approaches to realize a fractional delay include linearly interpolating the two adjacent poly-phase sub-filter coefficients and generating a new sub-filter. Then the generated sub-filter is used to filter the input data.

Figure 5:
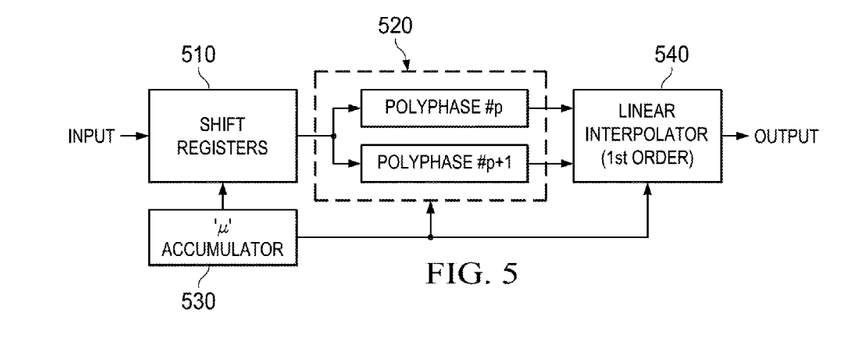
FIG. 5 is a block diagram of an example embodiment of linear interpolation in FIG. 4.

In an example embodiment of a linear interpolation approach, as provided in FIG. 5, the interpolation may occur between two output samples computed from adjacent polyphase filters where $$y((n+(p+\Delta)/N)T_i) = (1-\Delta)\sum_{k=0}^{L-1}x(n-k)h_p(k) + \Delta\sum_{k=0}^{L-1}x(n-k)h_{p+1}(k),$$

$$0 \leq \Delta \leq 1$$

with x(n) as input sequence, $h_p(k)$ as pth Poly-phase filter, and $\Delta$ as the normalized fractional delay between time instants corresponding to pth and (p+1)th poly-phase outputs. The linear interpolation approach may use 2 L+2 multiplication operations and 2 L addition operations to compute every output sample. Shift registers 510 store the current set of input samples x(n), . . . x(n−(L−1)). The μ accumulator 530 stores the timing offset (μ) of the output sampling points with regard to input sampling points. Whenever μ crosses one and rolls-over, it corresponds to shifting the input sequence by one sample. Polyphase filters 520 depicts two adjacent poly-phase filters p and p+1 operating on the current set of input samples from shift registers 510. Linear interpolator 540 takes the two outputs of poly-phase filters 520 and linearly interpolates them to generate the final output corresponding to the output sampling instant. The poly-phase filter index p and interpolation coefficient Δ may be computed based on μ as given in:

$p = \text{floor}(\mu*N)$ $\nabla = N*\mu - p$

The μ accumulator update equation is given as:

$\mu(k+1) = \text{mod}(\mu(k)+r, 1.0)$ $\text{IntegerShift} = \text{floor}(\rho(k)+r)$ where r is the resampling ratio given by $$r = \frac{\text{Input Frequency}}{\text{Output Frequency}}$$

Figure 6:
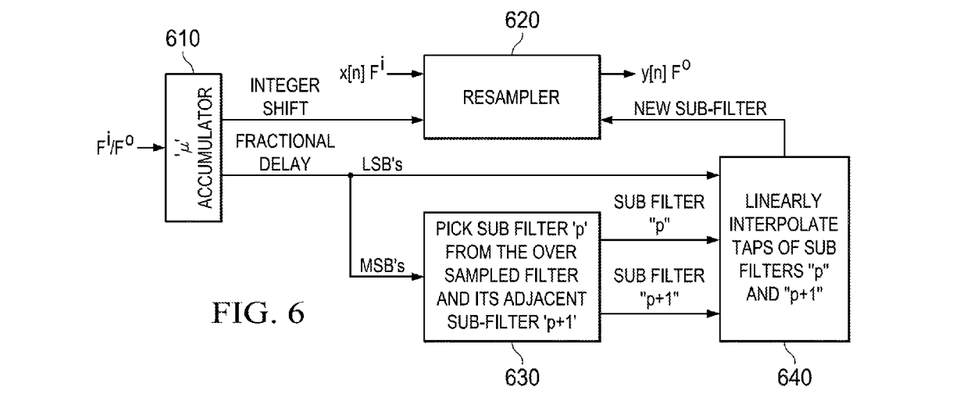
FIG. 6 is a block diagram of an example embodiment of a system of variable fractional rate digital resampling.

An example embodiment of an approach in which a new sub-filter is generated by linearly interpolating between adjacent sub-filter poly-phase coefficients, as shown in FIG. 6, is mathematically equivalent to the linear interpolation approach of FIG. 5 as $$y((n+(p+\Delta)/N)T_i) = \sum_{k=0}^{L-1}x(n-k)[(1-\Delta)h_p(k) + \Delta h_{p+1}(k)] =$$

$$\sum_{k=0}^{L-1}x(n-k)[h_p(k) + \Delta[h_{p+1}(k) - h_p(k)]]$$

The μ accumulator 610 functions as accumulator 530 of FIG. 5. The μ accumulator 610 outputs an integer shift and a fractional delay μ. This fractional delay is split into p and ∇. Selector 630 receives p as input and outputs the coefficients corresponding to pth and p+1th poly-phase filter. Linear interpolator 640 receives pth and p+1th poly-phases filters and V as input and linearly interpolates between the two poly-phase filters to generate a new sub-filter. Resampler 620 receives the input data and integer shift value and the generated sub-filter. For every integer-shift value, resampler 620 shifts the input sequence accordingly. Resampler 620 uses the current input sequence and the dynamically generated sub-filter and computes the final output.

This approach uses L multiplications and L addition operations to compute new sub-filter taps. A total of 2 L multiplication and 2 L−1 addition operations may be used to compute one output sample. The difference in successive sub-filter taps is small and would use less bits for representation due to a large upsampling factor N. Similarly Δ would use a lower number of bits for representation compared to fractional delay since it is effectively normalized to N times the input rate. Therefore, the L multiplications used to generate interpolated sub-filter taps are of lower bit-width and lower complexity. A coefficient multiplexing implementation to select a pth poly-phase filter out of the N polyphases may be further optimized by exploiting the fact that the interpolating filter is symmetric. It will result in L (N/2:1) multiplexers instead of L (N:1) multiplexers.

Typical communication transceiver applications have both I (in-phase) and Q (quadrature phase) arms. The new sub-filter may be shared between I and Q arms. In other applications such as MIMO beam-forming, multiple transceiver chains may be configured identically and all the chains can share the sub-filter generation logic thereby providing additional gains in terms of area and power consumption as shown later in FIG. 11.

An automotive radar application may be used as an example to highlight the key difference between using the systems and methods described herein and the polynomial resampler. The ADC specifications of automotive radar systems are quite stringent with >10 bit effective number of bits (ENOB) and >80 dB spurious-free dynamic range (SFDR). For this example, a sigma-delta ADC running at 3.6 GHz may be used. One of the key factors for this implementation is that the final sampling rate after decimation is variable. In the automotive radar space, the bandwidth of the IF signal can be as low as 1 MHz and as high as 26 MHz, depending on the use-case. The smaller bandwidths are typically applicable for slow frequency modulated continuous wave (FMCW) systems and certain short-range radar applications, whereas the larger bandwidths are applicable for emerging fast FMCW high-performance long range radar systems. The purpose of the resampler block is therefore to generate a fully flexible output sampling rate from the 3.6 GHz sigma-delta fixed rate ADC, while preserving the stringent SFDR specifications.

Figure 7A:
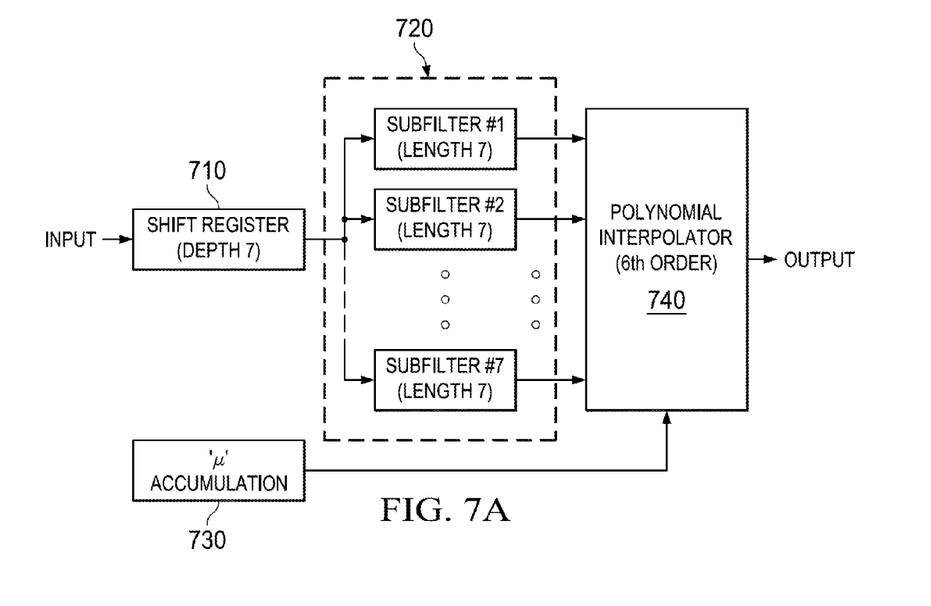
FIG. 7A is a block diagram of an example embodiment of a farrow structure polynomial resampler.
Figure 7B:
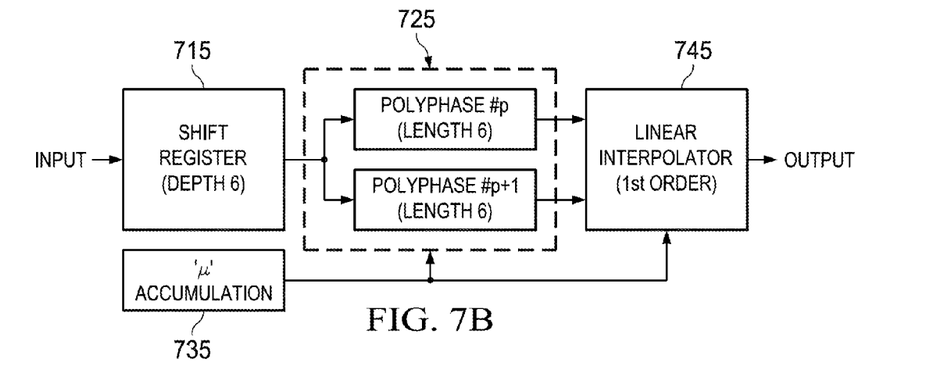
FIG. 7B is a block diagram of an example embodiment of upsampled linear interpolation.

A B-Spline polynomial resampler as shown in FIG. 7A would use a 6th order filter which implies the span of the impulse response is 7 samples with each output computation performing 6 multiplications. On the other hand, using the systems and methods disclosed herein in FIG. 7B involves an upsampling by N=64 followed by a 384 (64*6) tap filter which implies L=6 taps per sub-filter and, hence, 6 multiplications per output once the sub-filter is generated. Both schemes would compute the same number of multiplications per output sample but example embodiments of the systems and methods disclosed herein (FIG. 7B) would not use a droop correction filter since the 384 tap filter is designed not to introduce any droop in in-band spectrum. Further, the disclosed example embodiments do not use farrow filters banks 720 present in the farrow structure of the B-Spline polynomial resampler. For a similar span of the impulse response, the frequency response of the polynomial resampler is fixed whereas the upsampling filter has more flexibility and may be designed for a particular specification.

A farrow structure as provided in FIG. 3 may be used for a polynomial resampler approach in a power comparison to the example embodiments disclosed herein. A 6th order B-Spline polynomial resampler as provided in FIG. 7A, may be compared with a 384 tap FIR filter (N=64 polyphases with L=6 taps per polyphase) for an interpolator in the disclosed systems and methods as provided in FIG. 7B. To calculate power, the complexity of the implementations may be compared in terms of the number of multiply and addition operations for computing each output sample. Since the output data rate is the same for the two methods considered here, this complexity analysis directly relates to the overall power consumption.

The approach of FIG. 7A uses 6 multiply and 6 addition operations for computing one output sample using a 6th order polynomial. The approach of FIG. 7B uses 1 multiply and 2 addition operation since it is $1^{st}$ order linear resampler. There are 7 subfilters each of length 7 used for the approach of FIG. 7A, while the approach of FIG. 7B uses 2 polyphase filter outputs 725 (out of 64 polyphases) for computing one output sample with linear interpolator 745. The shift register lengths 710 and 715 are approximately the same for both approaches. Both also use the same μ accumulator 730 and 735. In the polynomial resampler, $6^{th}$ order polynomial interpolator 740 is used, whereas the upsampling linear interpolation method of FIG. 7B uses $1^{st}$ order linear interpolator 745. In general, the coefficient interpolation logic could also use any interpolation algorithm other than linear interpolation such as Zero Order Hold interpolation, second order polynomial interpolation, and so on.

To achieve lower power consumption in a fixed coefficient FIR filter implementation, a canonical signed-digit (CSD) implementation may provide better results than would using a generic multiplier. In the case of the interpolation filter as provided in FIG. 7B, connecting the same input samples to all polyphase filters 725 through shift register 715 results in computing all the outputs even though only 2 out of 64 outputs are selected for the final output computation.

Figure 8:
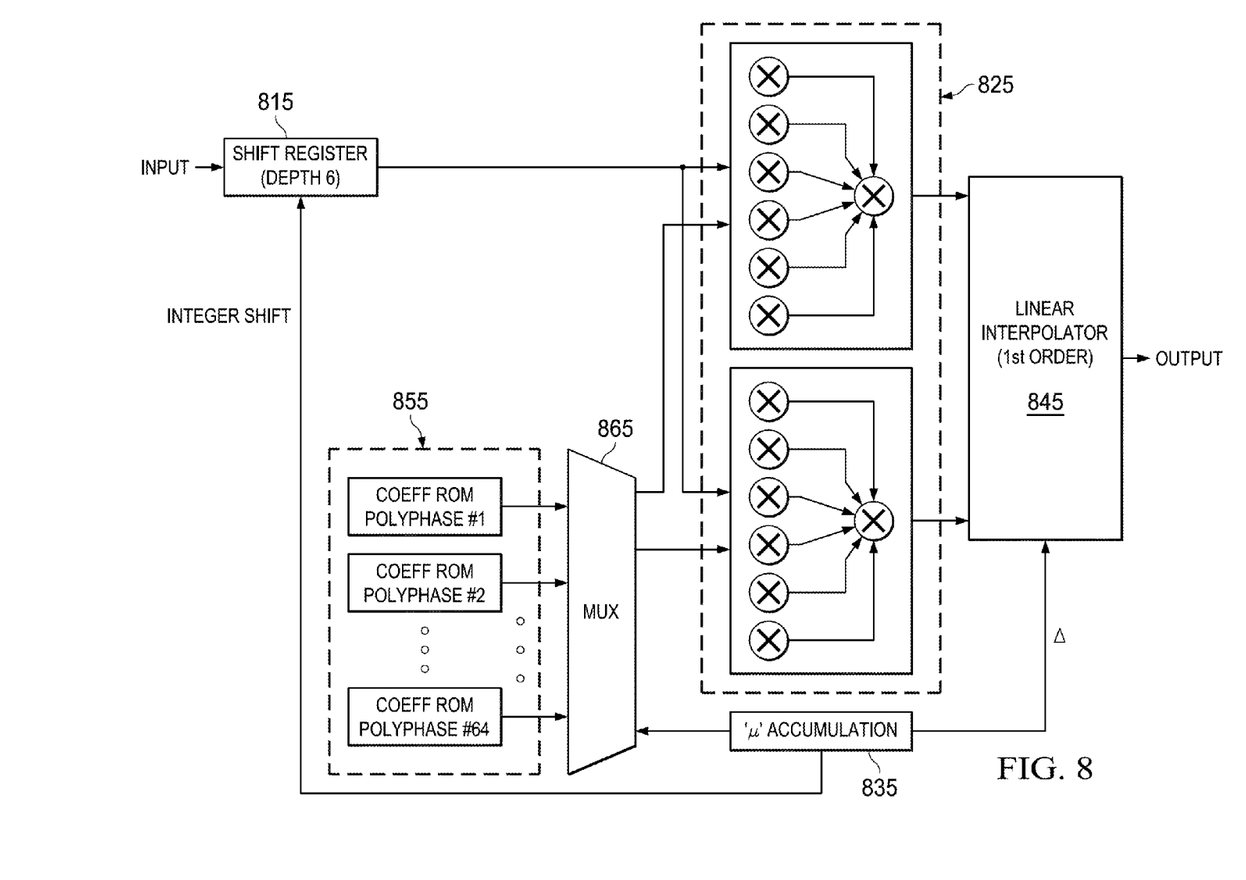
FIG. 8 is a block diagram of an example embodiment of a multiplier based resampler.
Figure 9:
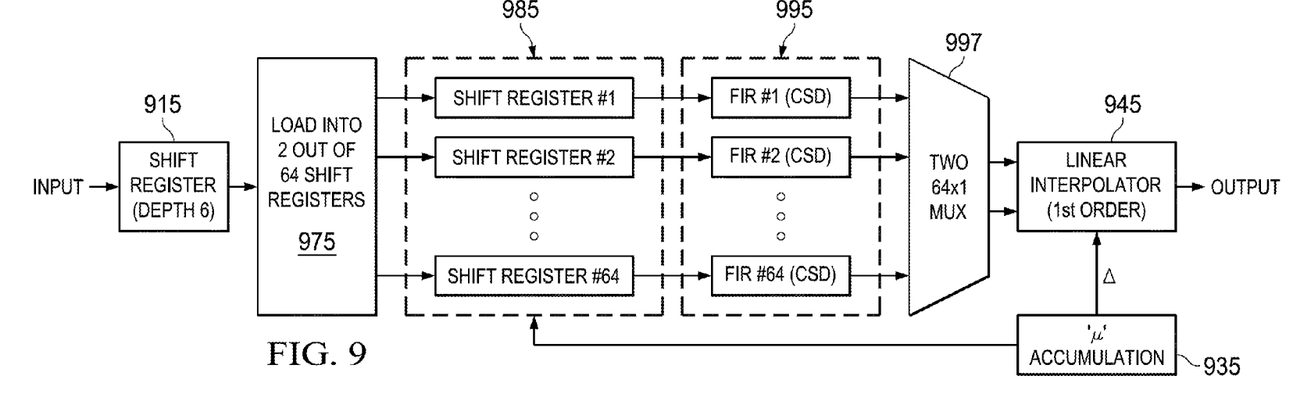
FIG. 9 is a block diagram of an example embodiment of a shift register copy based resampler.
Figure 10:
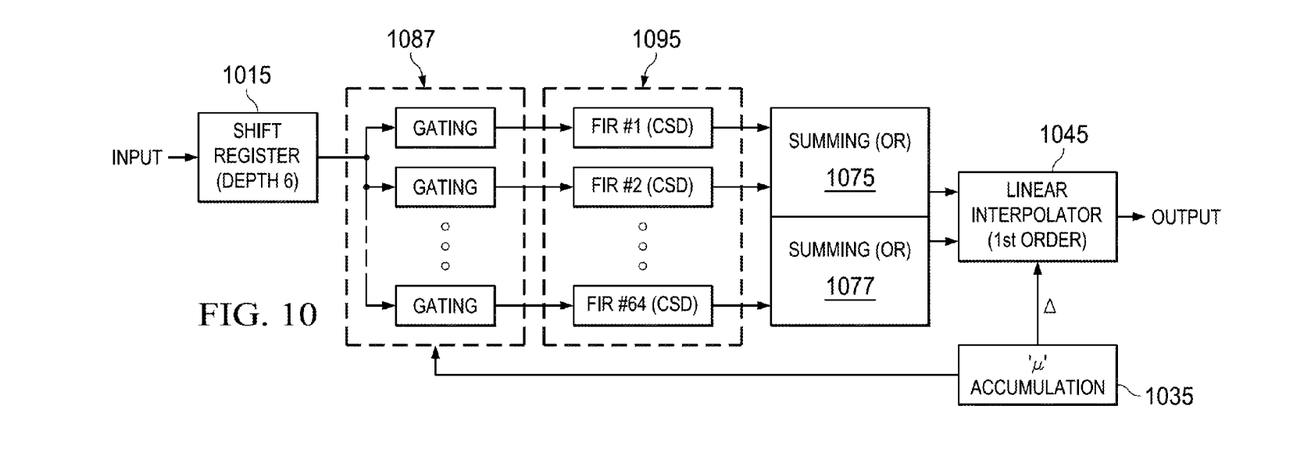
FIG. 10 is a block diagram of an example embodiment of a selective gating resampler.

Example embodiments of the disclosed systems and methods address the excess output computation issue as shown in FIG. 8, FIG. 9, and FIG. 10. In FIG. 8, a multiplier based implementation, an appropriate coefficient set is selected in multiplexer 865 from 64 polyphases 855 and generic multiply-add structure 825 computes each output. Multiplexer 865, may be for example a 322 multiplexer or a 641 multiplexer, among other implementations. The multiplier based implementation uses lesser area since a single multiplier/accumulator can be re-used across all polyphase coefficient sets, but it uses 12 generic multiplications for each output sample. Shift register 815 stores the 6 inputs $x(n), \ldots x(n-5)$ used for computing the current output. These 6 inputs are provided to polyphase filters 825. The μ accumulator 835, as with μ accumulator 530 and 610 of FIGS. 5 and 6, outputs an integer shift and a fractional delay μ. Linear interpolator 845 takes the two outputs from the two poly-phase filters p and p+1 and linearly interpolates between the two to compute the final output based on Δ provided by μ accumulator 835.

In FIG. 9, a shift register copy implementation, 64 copies of the data buffer are used so that only the two polyphase buffers are copied from the input while keeping the inputs to the other polyphases static. The shift register copy implementation uses much less toggling in FIR CSD computation logic block 995 compared to other options, but it presents a rather large load on the clock tree. It also uses larger area compared to a multiplier based option since CSD adders cannot be shared across different polyphases. Additionally, dynamic mux 997 is used to select the desired polyphase outputs. Shift register 915 stores the set of 6 input samples for computing the current output. Shift registers 975 take the 6 inputs provided by 915 and loads them into 2 out of the 64 sets of shift registers. These two correspond to p and p+1th poly-phase filters. Shift registers 985 provide 64 sets of shift registers where each set can store 6 samples. FIR CSD computation logic 995 implements 64 poly-phase filters for all 64 poly-phases The μ accumulator 935 generates the integer shift, p and Δ. Linear interpolator 945 takes in the two poly-phase filter outputs from multiplexer 997 and the value of Δ from μ accumulator 935 and computes the final output by linearly interpolating the two poly-phase filter outputs.

In FIG. 10, a selective gating implementation, gating logic 1087 at the input of each polyphase CSD adder tree enables the appropriate coefficient set while keeping the input to the other polyphases as zero. With the selective gating implementation, output muxing may be replaced with simple OR gates 1077 since unselected polyphase inputs/outputs are made zero explicitly by gating. It also uses much lower toggling than the multiplier based implementation. However, the selective gating implementation uses a larger area compared to the multiplier based implementation since CSD adders may not be shared across different polyphases. If the p polyphase is even, then the p+1 polyphase is odd and vice versa. Summing logic (OR) 1075 is used for the even set of polyphases and Summing logic (OR) 1077 is used for the odd set of polyphases. Shift register 1015 stores the set of 6 input samples for computing the current output. FIR CSD computation logic 1095 implements 64 poly-phase filters for all 64 poly-phases. The μ accumulator 1035 generates the integer shift p and Δ. Linear interpolator 1045 takes in the two poly-phase filter outputs from summing logic (OR) 1075 and summing logic (OR) 1077 and the value of Δ from μ accumulator 1035 and computes the final output by linearly interpolating the two poly-phase filter outputs. The pth poly-phase is obtained from the even set and the p+1th poly-phase is obtained from the odd set. Similarly, if pth poly-phase is obtained from the odd set, p+1th poly-phase is obtained from the even set.

The above comparison is examined for a single channel. In the case of receivers with I and Q components and multiple parallel chains (MIMO), the power consumption of proposed method may be further reduced by using the "coefficient muxing and interpolation" approach, which enables sharing of a major portion of the design across different chains. This kind of sharing is not possible with the polynomial resampler since the entire arithmetic operation is data dependent.

Figure 11:
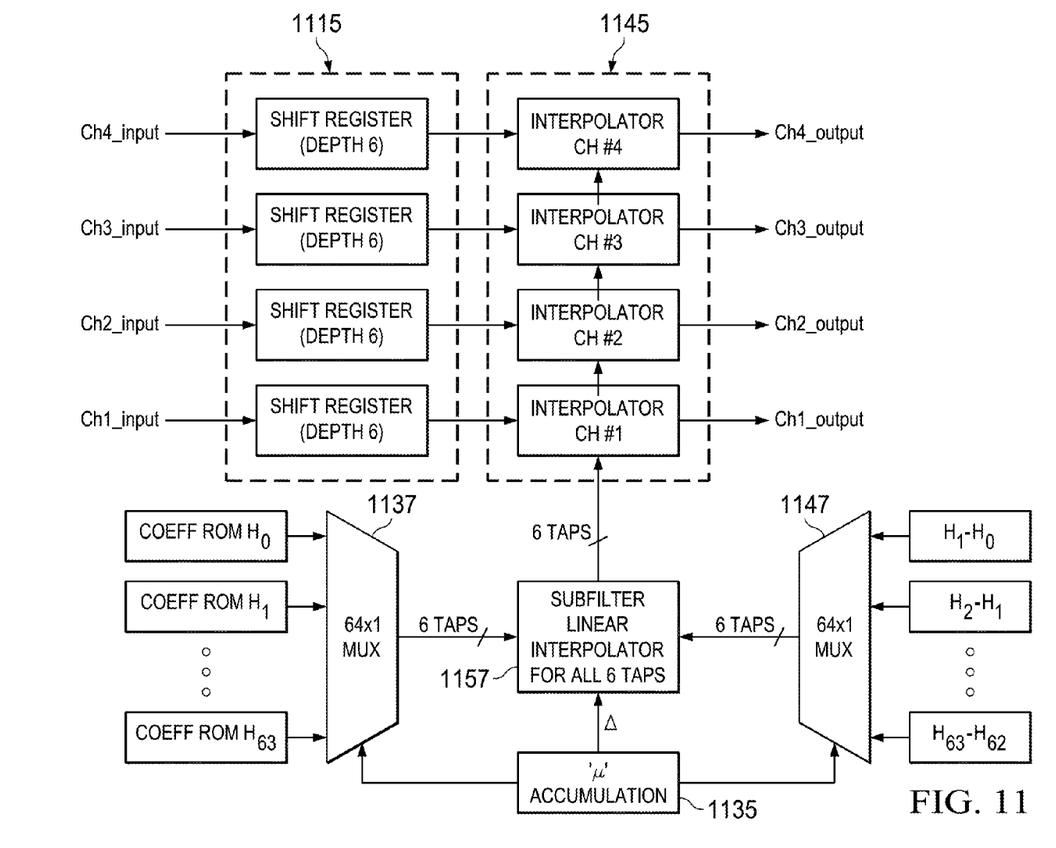
FIG. 11 is a block diagram of an example embodiment of generation of a new subfilter in the resampler.

FIG. 11 provides an example embodiment of two receiver chains, each with I and Q components (total of 4 parallel paths), sharing interpolator 1145. The new sub-filter computation may be performed by linearly interpolating between two adjacent poly-phase filter components. The new subfilter computation using coefficient interpolation may be shared across all 4 chains and interpolator 1145, which computes the final output and may be kept separate for each receiver chain. The interpolators normally use generic multipliers since the sub-filters are variable and depend on the instantaneous value of resampling coefficient µ. There is significant savings in the computation of subfilter 1157 being shared across all 4 chains (also referred to as input sequences or input streams). This figure shows linear interpolation between two adjacent poly-phases filter coefficients. In general, any interpolation scheme may be implemented on the coefficients, such as zero-order hold, second order, and third order, among others. Shift registers 1115 receive inputs for each of the four input streams. 64×1 multiplexer 1137 selects the pth poly phase filter $H_p(k)$. 64×1 multiplexer 1147 on the 64 differences of the poly-phase filters selects $H_{p+1}(k)-H_p(k)$. Linear interpolator 1157 receives $H_p(k)$, $H_{p+1}(k)-H_p(k)$ and $\Delta$ and generates the linearly interpolated sub-filter $H_p(k)+\Delta*(H_{p+1}(k)-H_p(k))$ to be used by the four streams.

In an example receive system having a fixed ADC rate $F^{adc}$ but variable bandwidth, $B^{min} \leq B \leq B^{max}$, with a variable output rate specification B*OSR. Further, assume that the receive chain has decimation by 2 filters to lower the sampling rate in order to perform baseband processing. The number of decimation by 2 filters in the chain is given by $$N = \text{ceil}\left[\log_2\left(\frac{F^{adc}}{B^{min}OSR}\right)\right]$$

where $B^{min}$ is the minimum bandwidth of the system. If the resampler is placed at the output of the $n^{th}$ decimation by 2 filter with resampling ratio r∈[1-2] such that r=1 corresponds to bandwidth $B^{min}$ and r=2 corresponds to bandwidth $B^{max}$.

The number of taps used by a filter for a given stop-band attenuation, A (dB), is given by $$\text{Taps} \propto \frac{F_s}{f_\Delta}\left(\frac{A(dB)-8}{14}\right)$$

where $F_s$ is the input sampling rate of the filter, $f_\Delta$ is the transition bandwidth and A is the target stop-band attenuation. Therefore, the filter complexity cost function is given by $$\text{Cost} \propto \frac{F_s}{f_\Delta}\left(\frac{A(dB)-8}{14}\right)F_{op}$$

where $F_{op}$ is the output rate of the filter. If the resampler is placed closer to the ADC, the number of taps used is lower, but the frequency of operation increases. The optimal placement is where their product is minimized. The resampling filter may be placed for the maximum pass band edge and minimum stop-band start which leads to the minimum transition bandwidth. Since the resampling ratio lies in the range [1-2], there are two extreme choices for the transition bandwidth, $f_{\Delta 1}$ and $f_{\Delta 2}$.

$$f_{\Delta 1} = \frac{0.5B^{max}}{f/2^n}\left[2^{N-n}OSR - \frac{3}{2}\right],$$

$$f_{\Delta 2} = \frac{B^{max}}{f/2^n}[2^{N-n}OSR - 1]$$

Since $f_{\Delta 1} < f_{\Delta 2}$, the resampling filter cost function is given by $$RCost(n) \propto \frac{2F^{adc}OSR}{2*\left[OSR - \frac{3}{2}2^{n-N}\right]},$$

$$n < \log_2\left(\frac{2^{N+1}OSR}{3}\right)$$

Minimizing the above with respect to n yields:

$$n = N + \log_2\left(\frac{OSR}{3}\right),$$

$$0 \leq n \leq \min\left(N, \log_2\left(\frac{2^{N+1}OSR}{3}\right)\right)$$

Therefore, the placement n̂ which minimizes the maximum cost for the resampler is given by $$\hat{n} = \underset{n^* \in [floor(n), ceil(n)]}{\text{argmin}} [RCost(n^*)]$$

Figure 12:
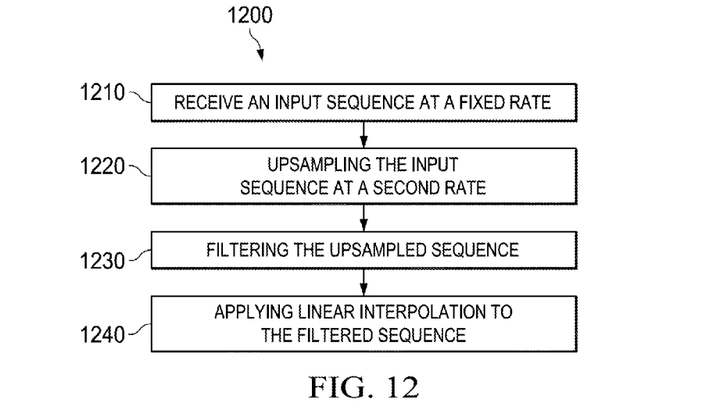
FIG. 12 is a flow diagram of an example embodiment of a method variable fractional rate digital resampling.

For an output OSR=3/2, the optimal placement is given by n̂=N−1. The optimal over-sampling specification at the output of the resampler is close to 3. The same analysis holds true for the placement of the resampler in the transmitter chain with the ADC replaced by a digital-to-analog convertor (DAC), decimation by 2 filters replaced by upsampling by 2 filters, and the direction of flow of signals being reversed. In general, a similar analysis can be done for any other system with the given specifications, FIG. 12 provides a flow chart of an example embodiment of a method of variable fractional rate digital resampling as disclosed herein. In block 1210, an input sequence is received at a fixed rate. In block 1220, the input sequence is upsampled to a higher rate. In block 1230, the upsampled sequence is filtered. In block 1240, linear interpolation is applied to the filtered sequence to get to the desired output rate.

Figure 13:
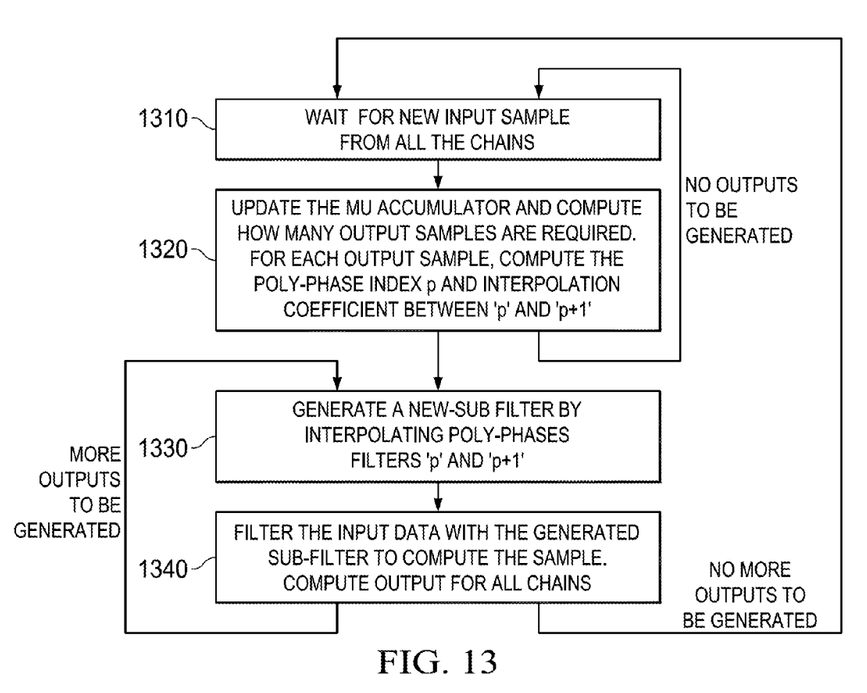
FIG. 13 is a flow diagram of an example embodiment of a method variable fractional rate digital resampling.

FIG. 13 provides a flow chart of an example embodiment of a method of variable fractional rate digital resampling as disclosed herein. In block 1310, a new input sample from all the chains is received. In block 1320, the µ accumulator is updated and the number of output samples is computed. For each output, poly-phase index p and interpolation coefficient between p and p+1 is calculated. In block 1330, a new sub-filter is generated by interpolating polyphase filters p and p+1. In block 1340, the input data is filtered with the generated sub-filter to compute the output sample and the outputs are computed for each chain. This may be repeated for every output sample.

Figure 14:
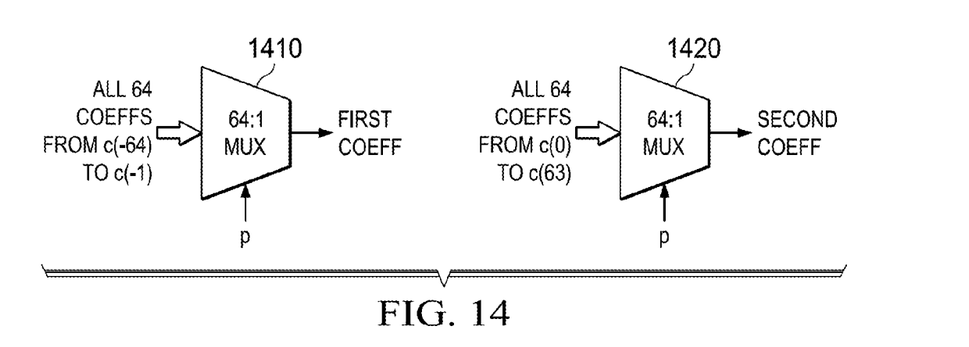
FIG. 14 is a block diagram of an example embodiment of multiplexing in the resampler.

FIG. 14 provides a method of selecting polyphase filter p out of N polyphases using coefficient multiplexing logic. In an example implementation, let the upsampling factor N=64 and the filter length be 128. There will be 64 polyphases and 2 coefficients per polyphase. The coefficients may be indexed from c(−64) to c(+63). Since it is a symmetric filter,
c(−64)=c(63),
c(−63)=c(62),
. . .
c(−1)=c(0)

The polyphases may now be indexed from P(0) to P(63). Each polyphase may be defined as
P(0)={c(−64), c(0)},
P(1)={c(−63), c(1)},
. . .
P(63)={c(−1), c(63)}.

In a typical implementation, as provided in FIG. 14, two multiplexers 1410 and 1420 would be used. Multiplexer 1410 may be used to select the first coefficient from the coefficients between c(−64) to c(−1) and multiplexer 1420 may be used to select the second coefficient from the coefficients between c(0) to c(63).

Figure 15:
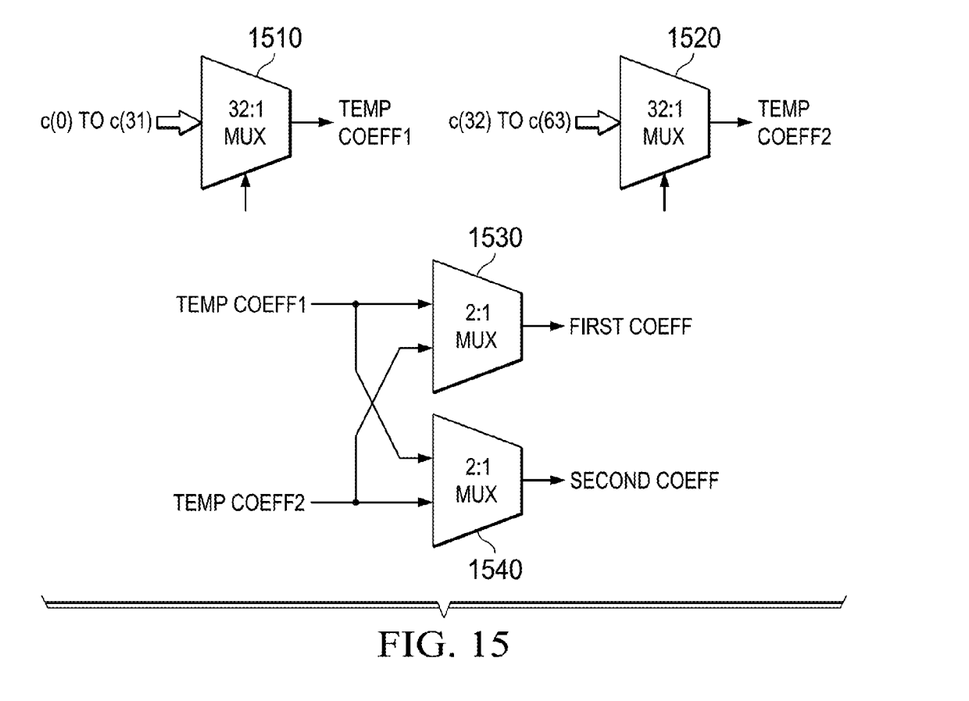
FIG. 15 is a block diagram of an example embodiment of multiplexing in the resampler.

FIG. 15 provides an example embodiment of utilizing the symmetry of the coefficients using two smaller multiplexers 1510 and 1520. Multiplexer 1510 receives inputs from {c(0), c(1), . . . c(31)} and multiplexer 1520 receives inputs from {c(32), c(33), . . . c(63)}. Multiplexer 1510 produces temporary coefficient1 and multiplexer 1520 produces temporary coefficient2. The temporary coefficients are fed into a pair of 2×1 multiplexers 1530, 1540. Multiplexer 1530 selects first coefficient from the two temporary coefficients and multiplexer 1540 selects a second coefficient from the two temporary coefficients.

The polyphase filters can be rewritten as
P(0)={c(63), c(0)},
P(1)={c(62), c(1)},
. . .
P(31)={c(32), c(31)},
P(32)={c(31), c(32)},
. . .
P(0)={c(0), c(63)}.

For the first 32 polyphases, P(0) . . . P(31), the first coefficient comes from multiplexer 1540 and the second coefficient comes from multiplexer 1530. For the last 32 polyphases, P(32) . . . P(63), the first coefficient comes from multiplexer 1530 and the second coefficient comes from multiplexer 1540. This implementation uses two 32×1 multiplexers instead of two 64×1 multiplexers with the output of each of the 32×1 multiplexers directed to either the first or second coefficient appropriately. Although this example implementation was directed to two coefficients per polyphase, it can be generalized to any number of coefficients per polyphase.

The flow charts of FIGS. 12 and 13 show the architecture, functionality, and operation of a possible implementation of the variable fractional rate digital resampling software. In this regard, each block represents a module, segment, or portion of code, which comprises one or more executable instructions for implementing the specified logical function(s). It should also be noted that in some alternative implementations, the functions noted in the blocks may occur out of the order noted in FIGS. 12 and 13. For example, two blocks shown in succession in FIG. 12 may in fact be executed substantially concurrently or the blocks may sometimes be executed in the reverse order, depending upon the functionality involved. Any process descriptions or blocks in flow charts should be understood as representing modules, segments, or portions of code which include one or more executable instructions for implementing specific logical functions or steps in the process, and alternate implementations are included within the scope of the example embodiments in which functions may be executed out of order from that shown or discussed, including substantially concurrently or in reverse order, depending on the functionality involved. In addition, the process descriptions or blocks in flow charts should be understood as representing decisions made by a hardware structure such as a state machine.

The logic of the example embodiment(s) can be implemented in hardware, software, firmware, or a combination thereof. In example embodiments, the logic is implemented in software or firmware that is stored in a memory and that is executed by a suitable instruction execution system. If implemented in hardware, as in an alternative embodiment, the logic can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In addition, the scope of the present disclosure includes embodying the functionality of the example embodiments disclosed herein in logic embodied in hardware or software-configured mediums.

Software embodiments, which comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, or communicate the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of the computer-readable medium would include the following: a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical). In addition, the scope of the present disclosure includes embodying the functionality of the example embodiments of the present disclosure in logic embodied in hardware or software-configured mediums.

Although the present disclosure has been described in detail, it should be understood that various changes, substitutions and alterations can be made thereto without departing from the spirit and scope of the disclosure as defined by the appended claims.

Therefore, at least the following is claimed:

1. A method comprising:
providing a plurality of poly-phase filters;
receiving an input sequence at a fixed rate;
upsampling the input sequence at an integer multiple of the fixed input rate;
applying linear interpolation to two adjacent poly-phase filters of said plurality of poly-phase filters to generate a new sub-filter; and
filtering the upsampled sequence using said new sub-filter to generate output samples at a desired output rate.

2. The method of claim 1, wherein applying linear interpolation comprises applying linear interpolation to the coefficients of two adjacent poly-phase filters to generate the new sub-filter.

3. The method of claim 1, wherein the generated sub-filter is shared among a plurality of finite impulse response filters applied to different input sequences.

4. The method of claim 1, further comprising selecting a first polyphase filter coefficient from negative coefficients and a second polyphase coefficient from positive coefficients of a symmetric finite response impulse filter, and wherein applying linear interpolation to the coefficients of two adjacent poly-phase filters comprises applying linear interpolation to the first and second polyphase filter coefficients to generate the new sub-filter.

5. The method of claim 1, further comprising:
separating filter coefficients into a first half and a second half;
selecting a first temporary coefficient from the first half of the coefficients and a second temporary coefficient from the second half of the coefficients; and
selecting the first temporary coefficient as a first output coefficient and the second temporary coefficient as a second output coefficient or selecting the first temporary coefficient as a second output coefficient and the second temporary coefficient as a first output coefficient; and
wherein applying linear interpolation to the coefficients of two adjacent poly-phase filters comprises applying linear interpolation to the first output coefficient and the second output coefficients to generate the new sub-filter.

6. A system comprising:
an upsampler configured to receive an input sequence at a first frequency and output a sequence at a second higher frequency;
a filter configured to filter the sequence at the second higher frequency, the filter comprising a plurality of poly-phase filter components that are dynamically selectable by loading inputs into selected poly-phase filters; and
a linear interpolator configured to interpolate an output of a first selected poly-phase filter component and a second selected poly-phase filter component to generate output samples at a desired rate.

7. The system of claim 6, wherein the and the plurality of poly-phase filter components comprises a plurality of finite impulse response (FIR) filters.

8. The system of claim 6, wherein each of the plurality of poly-phase filter components are operable to generate a filter output, the system further comprising:
logic that is operable to dynamically zero inputs of poly-phase filter components of the plurality of poly-phase filter components which are not to be used for a given sample;
a first OR gate configured to OR the outputs of a first subset of the plurality of poly-phase filter components to generate a first filter output;
a second OR gate configured to OR the outputs of a second subset of the plurality of poly-phase filter components to generate a second filter output; and
wherein the linear interpolator is operable to linearly interpolate between the first filter output and the second filter output.

9. The system of claim 6, wherein the linear interpolator is configured to apply interpolation to two adjacent poly-phase filters.

10. A non-transitory machine-readable medium including sequences of instructions, the sequences of instructions including instructions which when executed causes a machine to perform a method comprising:
receiving an input sequence at a fixed rate;
upsampling the input sequence at a second higher rate, the higher rate being an integer multiple of the fixed input rate;
dynamically activating two selected poly-phase filter components of a plurality of poly-phase filter components for a given output sample by loading inputs into the two selected poly-phase filter components, thereby enabling the outputs of the two selected poly-phase filter components;
filtering the upsampled sequence using the two selected poly-phase filter components; and
interpolating the outputs of the two selected poly-phase filter components to generate output samples at a desired output rate.

11. The non-transitory machine-readable medium of claim 10, wherein the instructions for filtering comprise instructions for filtering with a flat stop band.

12. The non-transitory machine-readable medium of claim 10, wherein the instructions for dynamically activating two selected poly-phase filters of a plurality of poly-phase filters comprise instructions for dynamically activating two selected finite impulse response (FIR) filters of a plurality of FIR filters.

13. The non-transitory machine-readable medium of claim 10, further comprising instructions for:
dynamically zeroing inputs of poly-phase filter components of the plurality of poly-phase filter components which are not to be used for a given output sample;
ORing the outputs of a first subset of the plurality of poly-phase filter components to generate a first filter output;
ORing the outputs of a second subset of the plurality of poly-phase filter components to generate a second filter output; and
wherein the instructions for linearly interpolating comprise instructions for linearly interpolating between the first filter output and the second filter output.

14. The non-transitory machine-readable medium of claim 10, wherein the instructions for interpolating comprise instructions for interpolating the outputs of two adjacent poly-phase filter components.

* * * * *